United States Patent
Roche et al.

(10) Patent No.: US 7,741,877 B2
(45) Date of Patent: Jun. 22, 2010

(54) CIRCUIT FOR DISTRIBUTING AN INITIAL SIGNAL WITH A TREE STRUCTURE, PROTECTED AGAINST LOGIC RANDOM EVENTS

(75) Inventors: Philippe Roche, Le Versoud (FR); Francois Jacquet, Froges (FR); Jean-Jacques De Jong, Grenoble (FR)

(73) Assignee: STMicroelectronics, SA, Montrouge (FR)

( * ) Notice: Subject to any disclaimer, the term of this patent is extended or adjusted under 35 U.S.C. 154(b) by 0 days.

(21) Appl. No.: 11/713,469

(22) Filed: Mar. 1, 2007

(65) Prior Publication Data

US 2007/0216464 A1    Sep. 20, 2007

(30) Foreign Application Priority Data

Mar. 1, 2006   (FR)   .................................. 06 01832

(51) Int. Cl.
*H03K 19/00*   (2006.01)
*G06F 1/04*    (2006.01)

(52) U.S. Cl. ............................. 326/93; 326/95; 326/9; 326/13; 326/15; 327/295

(58) Field of Classification Search ............... 326/9–15, 326/93, 95, 98; 327/295
See application file for complete search history.

(56) References Cited

U.S. PATENT DOCUMENTS

| | | | | |
|---|---|---|---|---|
| 6,327,176 B1 * | 12/2001 | Li et al. | ......................... | 365/156 |
| 6,362,676 B1 * | 3/2002 | Hoffman | ..................... | 327/295 |
| 6,456,138 B1 * | 9/2002 | Yoder et al. | ................. | 327/293 |
| 6,614,257 B2 * | 9/2003 | Knowles | ......................... | 326/9 |
| 6,703,858 B2 * | 3/2004 | Knowles | ......................... | 326/9 |
| 6,753,694 B2 * | 6/2004 | Eaton | ........................... | 326/13 |
| 6,765,405 B2 * | 7/2004 | Hugues et al. | ................ | 326/26 |
| 2001/0030567 A1 | 10/2001 | Wood et al. | | |
| 2003/0179030 A1 | 9/2003 | Gardner | | |
| 2003/0214772 A1 | 11/2003 | Hugues et al. | | |
| 2004/0130373 A1* | 7/2004 | Roy | ........................... | 327/295 |

FOREIGN PATENT DOCUMENTS

EP   1 387 494 A   2/2004

OTHER PUBLICATIONS

French Search Report for FR 0601832 dated Feb. 15, 2007.

* cited by examiner

*Primary Examiner*—Vibol Tan
(74) *Attorney, Agent, or Firm*—Lisa K. Jorgenson; Kevin D. Jablonski; Graybeal Jackson LLP

(57) ABSTRACT

An embodiment of the invention relates to a circuit for distributing an initial signal, comprising an input node receiving the initial signal, a plurality of terminal nodes each providing at least one resulting signal to a circuit component, and different connection branches between the input node and the plurality of terminal nodes, to which a plurality of intermediate nodes is connected, wherein connection branch is duplicated, so that each node among the input node and the intermediate nodes comprises two inputs and two outputs allowing double propagation of the initial signal towards the terminal nodes through duplicated connection branches, each terminal node terminal node receiving two input signals, images of the initial signal and providing the resulting initial signal:
an image of the input signals if said input signals are identical, or
inactive, if the input signals are different from each other.

23 Claims, 6 Drawing Sheets

CIRCUIT FOR DISTRIBUTING AN INITIAL SIGNAL WITH A TREE STRUCTURE, PROTECTED AGAINST LOGIC RANDOM EVENTS

PRIORITY CLAIM

This application claims priority from French patent application No. 0601832, filed Mar. 1, 2006, which is incorporated herein by reference.

TECHNICAL FIELD

An embodiment of the present invention relates to a circuit for distributing a logic signal having a tree structure protected against a logic random event.

An embodiment of the invention is notably interesting for any integrated circuit comprising a distribution circuit formed by a tree structure, comprising various branches with which a set of components of the integrated circuit may be powered with a single initial signal, for example, using for their operation a clock signal or even a reset signal. These circuit components, for example, comprise, but in a non-limiting way, flip-flop-type latches, latch type latches, or more generally logical circuits using a clock, set, or reset signal.

BACKGROUND

A logic random event is a specific change in state or a transitional state (voltage and/or current peak) at one point of the integrated circuit. Logic random events may have different origins. The consequences of a logic random event may be diverse and of variable significance. For example in a memory, a logic random event may cause the change of the contents of a memory cell, which may have to be reprogrammed in order to recover its initial value.

A logic random event is for example induced by the impact of an energetic particle at a point of the circuit. Such a random event is known as a single event upset (or SEU).

This type of random event was, up to now, primarily encountered in the integrated circuits used for space applications, because of ionizing radiation encountered outside the protective atmospheric layers of the Earth. Within the framework of earthborn applications, this type of random event is also increasingly frequent, because of the constant and gradual miniaturization of integrated circuits, which makes the latter increasingly sensitive to their environment.

The impact of an energetic particle typically causes provision of charges in the circuit, which provision generally is expressed by a voltage or current peak, at a point of the circuit corresponding to the impact point in the case of an SEU. The current or voltage change is generally of a very short duration, of the order of a few picoseconds to a few hundreds of picoseconds.

If C denotes the equivalent capacitance of the circuit downstream from the perturbed point of the circuit, then the voltage change $\Delta V$ at the relevant perturbed point is written as $\Delta V = \Delta Q/C$, $\Delta Q$ being the change in charge resulting from the impact of the particle.

Thus, for example, for a downstream logic circuit exclusively using logic signals, if the change in voltage $\Delta V$ is sufficiently small so as not to cause the change of state of a perturbed logic signal, then the perturbation disappears within a relatively short time, without any consequence for the downstream circuit.

If, on the other hand, the voltage change $\Delta V$ is larger, and notably sufficient for changing the value of a logic signal, then the consequences may be significant. A random event may thus cause latching of an inverter, reprogramming of a memory cell of the SRAM type, etc.

The voltage change due to the change in charge resulting from the impact at a point of the circuit may, therefore, not have any incidence on the circuit; or, on the contrary, it may cause a logic random event if the provided charge is larger than the critical charge of the circuit, which defines the minimum charge needed to cause the occurrence of a logic random event, i.e., a change in logic state at a point of the circuit.

Taking this phenomenon into account is particularly important in the context of circuits having a tree structure, since a random event of such a circuit may possibly have the consequence of simultaneously perturbing several components of the circuit along the branch of the circuit within a tree structure in which the random event occurs.

As an example, FIG. 1 schematically illustrates a clock circuit of an integrated circuit, formed by a tree structure comprising different branches 50-57, with which, for example, all of the components 1-16 of the integrated circuit, for example flip-flop latches, may be fed with a same initial clock signal CLK. Buffers 17-47 are generally placed along the different branches of the clock circuit to control reductions in signal level due to losses along the branches on the one hand, and phase differences generated by different branch lengths on the other hand. The buffers thus used in a clock circuit for propagating, and possibly amplifying and/or phase-shifting, a received signal generally comprise two simple inverters in series.

The consequences of a random event on a circuit such as the clock circuit of FIG. 1 may therefore be significant, since several components of the circuit may be perturbed simultaneously, along the branch of the clock circuit on which the random event occurs. For example, if a buffer 20 of the circuit is hit by an energetic particle inducing an inversion of logic state at this point of the circuit, the buffer will propagate an erroneous logic information to all of the components 1-4 connected to the terminal nodes of the clock circuit. The random event on the relevant branch of the clock circuit may, for example, cause erroneous latching of the clock signal feeding the relevant components of the integrated circuit. A first consequence for the components of the circuit using this same distributed clock signal is desynchronization of these components relative to the other components of the integrated circuit. A second consequence is the possible modification of these components: change of state of a latch, etc.

It is, therefore, desirable to protect the clock circuit of an integrated circuit against a logic random event to limit the risks of perturbation of the circuit components which use the clock signal.

The problem described here according to the example of FIG. 1 with reference to a clock circuit may, however, be extended to any integrated circuit comprising a circuit having a tree structure provided for distributing a same initial signal to a set of components of the circuit which use this initial signal for their operation. As an example, this may also be a circuit distributing a set or reset signal to a set of flip-flop latches connected at the terminal nodes of this distribution circuit; these latches may, for example, be chained so as to form a shift register.

SUMMARY

An embodiment of the invention is a logic signal distributing circuit having a tree structure protected against logic random events.

An embodiment of the invention relates to a circuit for distributing an initial logic signal towards a plurality of circuit components, formed by a tree structure comprising an input node receiving the initial signal and a plurality of terminal nodes each providing at least one resulting initial signal to a respective circuit component of the plurality of components to which it is connected at the output, the structure comprising various connection branches between the input node and the plurality of terminal nodes, to which a plurality of intermediate nodes is connected, so as to propagate the initial signal towards the terminal nodes, wherein each connection branch between the nodes is duplicated so that each node among the input node and the intermediate nodes comprises two inputs and two outputs providing dual propagation of the initial signal towards several nodes through the duplicated connection branches, each terminal node receiving two input signals, images of the initial signal and providing the resulting initial signal at the output, which is:

the image of the input signals if said input signals are identical, or inactive, if the input signals are different from one another.

According to a first embodiment, each node of the tree structure among the input node and intermediate nodes is duplicated in a first duplicated node and a second duplicated node, each comprising an input and an output respectively, connected to a respective duplicated branch of the tree structure.

According to this first embodiment, each duplicated node comprises a single simple inverter.

The duplicated nodes may be spatially distant from each other on the circuit.

According to a second embodiment, each node among the input node and the intermediate nodes comprises a complex inverter with two inputs and two outputs to respectively receive on the first input and the second input either one of the doubled signals propagated through the duplicated connection branches, and for respectively providing on the first output and the second output, first and second resulting signals, which respectively are:

the inverse of said received doubled signals if said received doubled signals are identical, or inactive if said received doubled signals are different from each other.

The complex inverter according to the second embodiment comprises:

a first p-type transistor receiving a power supply voltage on a source, a second p-type transistor, a source of which is connected to a drain of the first transistor, a third n-type transistor a drain of which is connected to a drain of the second transistor, a fourth n-type transistor, a drain of which is connected to a source of the third transistor and a source of which is connected to a ground of the circuit, a fifth p-type transistor receiving the power supply voltage on a source, a sixth p-type transistor, a source of which is connected to a drain of the fifth transistor, a seventh n-type transistor, a drain of which is connected to a drain of the sixth transistor, an eighth n-type transistor, a drain of which is connected to a source of the seventh transistor and a source of which is connected to the ground of the circuit, a gate of the first transistor, a gate of the third transistor, a gate of the fifth transistor and a gate of the seventh transistor being connected together to one of the two inputs of the complex inverter, a gate of the second transistor, a gate of the fourth transistor, a gate of the sixth and a gate of the eighth transistor being connected together to the other of the two inputs of the complex inverter, a common drain of the second and third transistors being connected to one of the outputs of the complex inverter, and a common drain of the sixth and of the seventh transistors being connected to the other of the two outputs of the complex inverter.

Advantageously, each terminal node of the circuit comprises a complex inverter with two inputs and one output, comprising:

a first p-type transistor receiving a power supply voltage on a source, a second p-type transistor, a source of which is connected to a drain of the first transistor, a third n-type transistor, a drain of which is connected to a drain of the second transistor, a fourth n-type transistor, a drain of which is connected to a source of the third transistor and a source of which is connected to a ground of the circuit, a gate of the first transistor and a gate of the third transistor being connected together in order to receive one of the two input signals on the first input, a gate of the second transistor and a gate of the fourth transistor being connected together in order to receive the other of the two input signals on the second inputs, and a common drain of the second and third transistors providing the resulting initial signal to the circuit component connected to the output of the complex inverter forming the terminal node.

Preferably, the circuit comprises an even number of nodes in the tree structure upstream from a circuit component connected to the output of a terminal node.

In one alternative, the circuit comprises an odd number of nodes in the tree structure upstream from a circuit component connected to the output of a terminal node.

A circuit according to an embodiment of the invention may be a clock circuit distributing a clock signal to different circuit components.

This circuit also be a circuit distributing a set or reset signal to different circuit components.

BRIEF DESCRIPTION OF THE DRAWINGS

Features and advantages of one or more embodiments of the present invention may become more clearly apparent upon reading the following description of an exemplary embodiment of a clock circuit, given as an illustrative and non-limiting example and made with reference to the appended figures.

DETAILED DESCRIPTION

Figure 1:
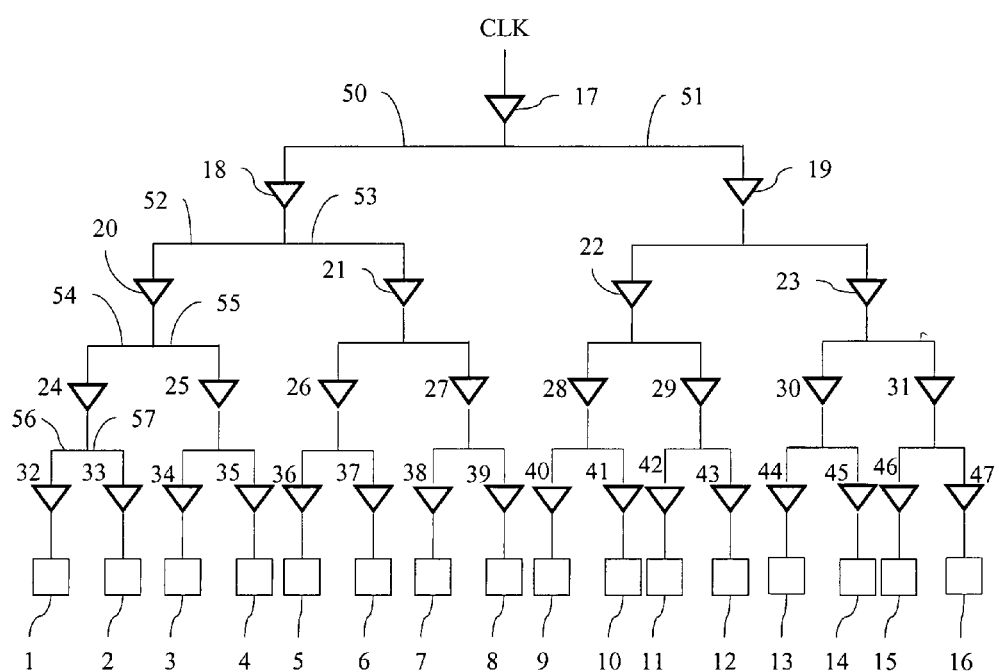
FIG. 1 is a functional diagram of a known clock circuit of an integrated circuit.

As discussed in the foregoing, a known distribution circuit, such as the clock circuit of FIG. 1, which has a tree structure, comprises different connection branches between the input node of the tree structure and the terminal nodes of the structure, to which are connected the intermediate nodes of the structure with which the clock signal CLK received at the input of the circuit may propagate toward the circuit components connected at the output of the terminal nodes.

In order to protect such a circuit against logic random events, an embodiment of the present invention first of all proposes duplication of each connection branch of the structure. Thus, by duplicating the connection branches between the nodes, if the signal on a branch is altered, the other signal on the duplicated branch typically remains unchanged.

Each node among the input node and the intermediate nodes then comprises two inputs, each connected to a respective branch of the corresponding upstream duplicated branch, and two outputs, each connected to a respective branch of the corresponding downstream duplicated branch. In this way, double propagation of the initial clock signal which should be transmitted to the different circuit components, may be obtained through the duplicated connection branches down to the terminal nodes of the structure.

Figure 2:
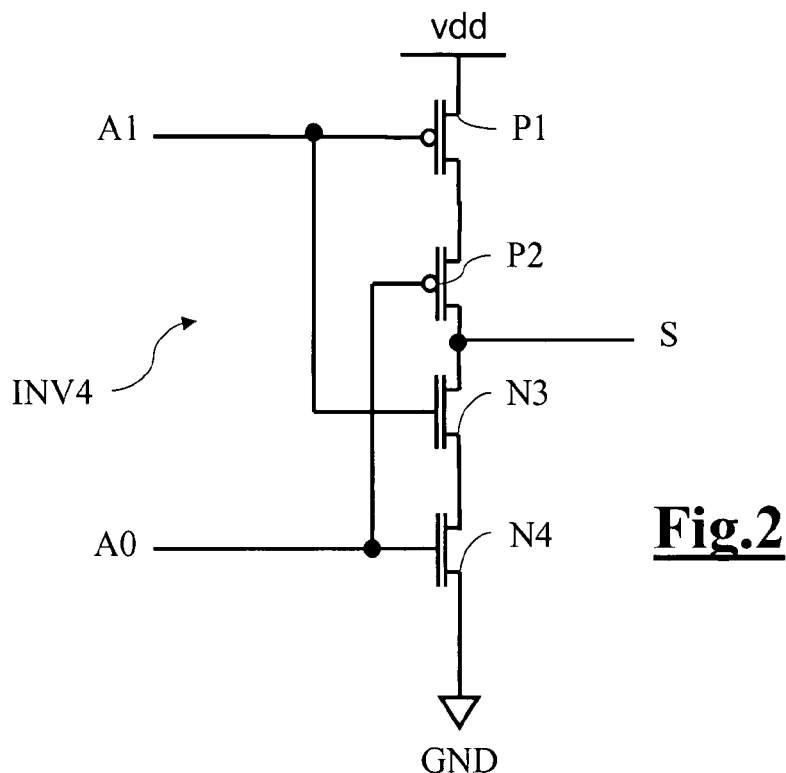
FIG. 2 illustrates the structure of an embodiment of a protected inverter, usable for the terminal nodes of the circuit of FIG. 1.

Referring to FIG. 2, each terminal node according to an embodiment of the invention includes a complex inverter INV4 with two inputs A1 and A0 and with an output S. The inverter, therefore, comprises two inputs A1 and A0 each receiving an input signal respectively transmitted via both duplicated branches connecting the upstream intermediate node to the terminal node. Both input signals thereby applied to a terminal node by duplicating the connection branches of the structure correspond to images of the initial signal as propagated by the upstream nodes.

The terminal nodes further have the property to not propagate information received at the input when they are not synchronous and of a same nature. More specifically, the complex inverter forming a terminal node allows the received input signals to be combined in order to obtain the resulting clock signal at the output S of the inverter, so that the resulting signal is either the inverse of the input signals if the latter are identical, or inactive i.e., transiently placed in a high impedance state, if the input signals are different from each other. The high impedance transient state of the output of the terminal node is maintained as long as the input signals are different from each other. The output therefore typically retains its prior logic state, the latter being maintained capacitively during the entire duration of the perturbation.

Thus, if the input signals have not been perturbed by a random event, then they are identical and the terminal node provides an inverse resulting signal. On the other hand, if either one of the input signals received at a terminal node is perturbed by a random event, then the resulting signal is at a high impedance. The resulting signal will then resume the state prior to the perturbation as soon as the latter has ended.

To do this, the complex inverter INV4 comprises two p-type transistors P1, P2 and two n-type transistors N3, N4 connected in series. A power supply voltage VDD is applied on a source of the transistor P1, a drain of which is connected to a source of the transistor P2. A source of the transistor N3 is connected to the drain of the transistor N4, a source of which is connected to a ground GND of the circuit.

A gate of the transistor P1 and a gate of the transistor N3 are connected together to the input A1, and a gate of the transistor P2 and of the transistor N4 are connected together to the input A0. Finally, a drain of the transistor P2 and a drain of the transistor N3 are connected together to the output S of the inverter.

The complex inverter INV4 operates in the following way:
If the input signals applied on A1 and A0 are identical, then:

if A0=A1=1, then P1 and P2 are off and N3 and N4 are on simultaneously, and the output S is equal to GND, i.e., a logic <<0>>, or if A0=A1=0, then N3 and N4 are off and P1 and P2 are on simultaneously and the output S is equal to VDD, i.e., a logic <<1>>.

Conversely, if the input signals are different from each other, then transistors P1, P2 or N3, N4 are never on simultaneously, and the output S remains undetermined, at high impedance.

With the structure described in FIG. 2, it is noted that if the input signals were perturbed simultaneously, then the perturbation would be transmitted on the resulting output signal of the terminal node. However, this possibility is very unlikely to the extent that it assumes that two random events of equivalent significance will perturb the circuit in two distinct points, simultaneously.

Moreover, according to the example of the described clock circuit, the terminal node provides a unique resulting clock signal. However, according to one alternative, the number of clock signals produced by the terminal nodes of the clock circuit may depend on the use which is made of it, in the downstream circuit components connected at the output of the terminal nodes. Indeed, certain circuit components use a single clock signal and others may use more of them. For example, a terminal node may then comprise a second complex inverter, comprising a first input and a second input in order to respectively receive either one of the input signals applied on the node, and an output on which a second resulting clock signal is provided. The number of signals provided by the terminal nodes may therefore vary depending on the requirements of the downstream circuits which use them, however, the global protection level of the circuit which one wishes to obtain, may also be taken into account, because there are then more logic structures at the terminal nodes capable of being impacted by an energetic particle.

Figure 3:
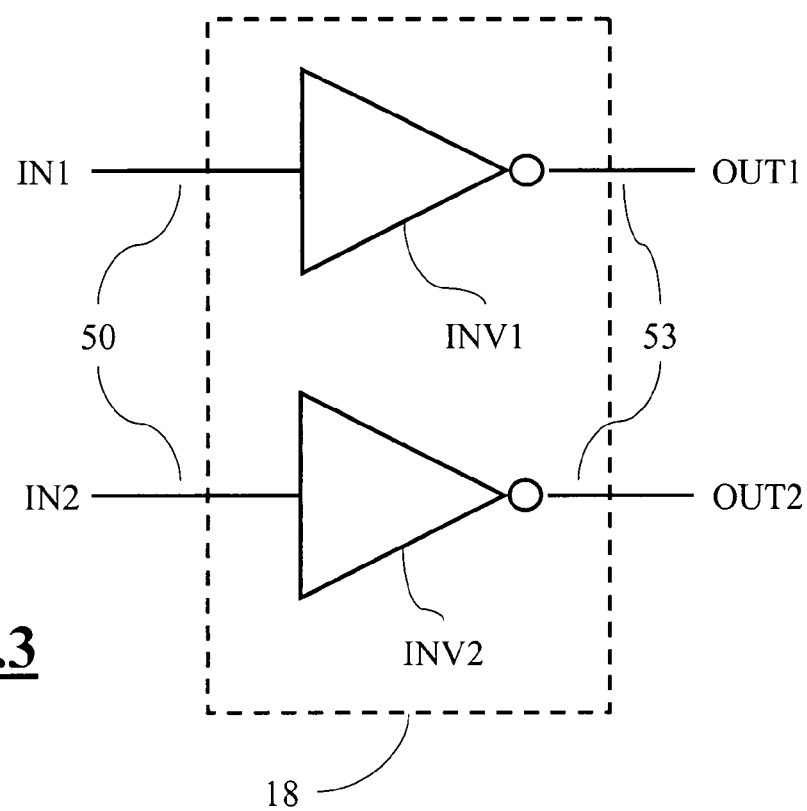
FIG. 3 illustrates a first embodiment for the input and intermediate nodes of the circuit of FIG. 1.

FIG. 3 now illustrates a first embodiment for the upstream nodes, relatively to the terminal nodes of the clock circuit of the example.

According to this first embodiment, each buffer 17-31 (FIG. 1), among the input buffer and the intermediate buffers, is also itself duplicated. Thus, according to this first embodiment, the whole clock tree is duplicated, i.e., both the connection branches and the nodes, with the exception of the terminal buffers 32-47 and the components 1-16. The complex inverters with two inputs to one output forming each terminal node such as those described above, allow both of these duplicated clock trees to be merged.

As an example, FIG. 3 more particularly illustrates the functional structure of the intermediate node 18 of FIG. 1. In fact, the latter therefore includes a first duplicated node INV1 and of a second duplicated node INV2. Each duplicated node INV1 and INV2 includes a single simple inverter according to an embodiment of the invention.

The simple inverter INV1 comprises an input IN1 connected on one of the two branches of the duplicated upstream branch 50 and an output OUT1 connected on one of the two branches of the duplicated downstream branch 53. The simple inverter INV2 comprises an input IN2 connected on the other of the two branches of the duplicated upstream branch 50 and an output OUT1 connected on the other of the two branches of the duplicated downstream branch 53.

The duplicated structures, i.e., the branches and the nodes, allowing duplication of the clock tree upstream from the terminal nodes of the circuit, may be spatially distant from each other on the circuit, unlike what the symbolic illustration given by FIG. 3 may suggest. With this, it is possible to avoid almost all risk that a same particle may simultaneously impact two duplicated identical nodes in both clock trees, and more generally, a common point between both duplicated clock trees.

A potential drawback of this embodiment is that it may not prevent propagation of a random event through the tree structure down to the terminal nodes. Indeed, if a perturbation occurs at a point of one of the duplicated clock trees, although it may never be transmitted to downstream circuit components which are protected by the terminal nodes, made safe according to the operating principle described earlier, it may nevertheless be transmitted by the simple inverters of the intermediate nodes located downstream from the perturbation through the relevant tree structure until it reaches the level of the terminal nodes. Several terminal nodes may then consequently have their output placed in a high impedance state for a transient period.

Figure 4:
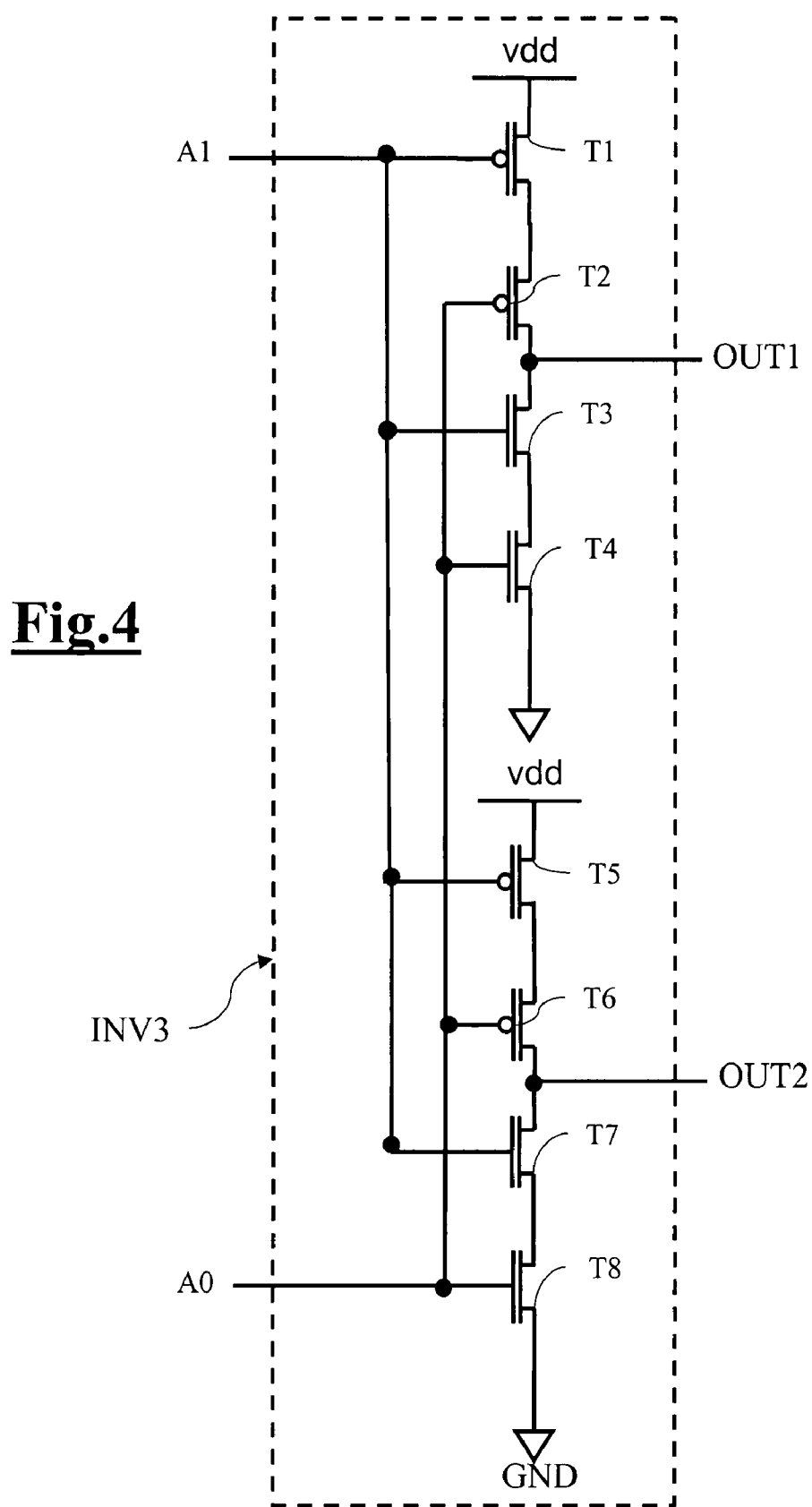
FIG. 4 illustrates a second embodiment for input and intermediate nodes of the circuit of FIG. 1. B1

Referring to FIG. 4, a second embodiment is provided, advantageously allowing the nodes located downstream from a perturbation in the tree structure not to be impacted. This embodiment is based no longer on duplication of the nodes, but on the use for each node among the input node and the intermediate nodes, of a complex inverter INV3 with two inputs and two outputs.

The complex inverter INV3 allows the input signals received at inputs A1 and A0 to be combined in order to obtain the resulting output signals at the outputs OUT1 and OUT2 of the inverter, so that the resulting signals are either the inverse of the input signals if the latter are identical, or inactive, i.e., transiently placed in a high impedance state, if the input signals are different from each other. The high impedance transient state of the output of the inverter is maintained as long as the input signals are different from each other.

Thus, if the input signals applied to the inverter have not been perturbed by a random event, then they are identical and the inverter provides inverse resulting signals. On the other hand, if either one of the input signals received at the inverter is perturbed by a random event, then the resulting signals are at high impedance. In this way a perturbation is immediately stopped by such an inverter and may therefore not propagate towards the nodes located downstream from the inverter in the tree structure, so that the terminal nodes are not impacted.

The complex inverter INV3 in fact comprises two complex inverters of the type already described with reference to FIG. 2, coupled together.

A first complex inverter comprises two p-type transistors T1, T2, and two n-type transistors T3, T4, connected in series. A power supply voltage VDD is applied on a source of the transistor T1, a drain of which is connected to a source of the transistor T2. A source of the transistor T3 is connected to the drain of the transistor T4, a source of which is connected to a ground GND of the circuit. A second complex inverter comprises two p-type transistors T5, T6 and two n-type transistors T7, T8 connected in series. A power supply voltage VDD is applied on a source of the transistor T5, a drain of which is connected to a source of the transistor T6. A source of the transistor T7 is connected to the drain of the transistor T8, a source of which is connected to the ground GND of the circuit.

A gate of the transistor T1, a gate of the transistor T3, a gate of the transistor T5 and a gate of the transistor T7 are connected together at the input IN1 of the inverter INV3, while a gate of the transistor T2, a gate of the transistor T4, a gate of T6 and a gate of transistor T8 are connected together to the other input IN2 of the inverter INV3. The common drains of the transistor T2 and of the transistor T3 are connected to the output OUT1 of the complex inverter INV3, and the common drains of the transistor T6 and of the transistor T7 are connected to the other output OUT2 of the complex inverter.

The complex inverter INV3 operates in the following way:

If the input signals applied on IN1 and IN2 are identical, then:

if IN1=IN2=1, then T1, T2, T5 and T6 are off and T3, T4, T7 and T8 are on, simultaneously. The outputs OUT1 and OUT2 are equal to GND, i.e., to a logic <<0>>, or if IN1=IN2=0, then T3, T4, T7 and T8 are off and T1, T2, T5 and T6 are on, simultaneously and the outputs OUT1 and OUT2 are equal to VDD, i.e., a logic <<1>>.

Conversely, if the input signals are different from each other, then the transistors T1, T2, T5 and T6 or T3, T4, T7 and T8 are never on, simultaneously and the outputs OUT1 and OUT2 remain undetermined at high impedance.

Consequently, a perturbation occurring at a point of the circuit is not transmitted down to the terminal nodes.

Regardless of the embodiment used, each buffer/node of the circuit according to the embodiment is formed by an inverter. Such a node structure is particularly advantageous in terms of protection, considering the buffers conventionally used in clock circuits, which typically comprise two inverters connected in series. Indeed, by using a single inverter for the nodes of the circuit, it is possible to minimize the number of structures of the circuit capable of being impacted by a logic random event.

Moreover, as each node of the clock circuit is formed by an inverter, the clock circuit typically includes an even number of inverters in the tree upstream from a circuit component connected at the output of a terminal node of the clock circuit to recover the initial clock signal at the output of the terminal node. However, here, this is a simple problem of convention and an odd number of inverters may also be provided, considering that the signal applied to the circuit components is then the inverse of the initial clock signal.

Figure 5:
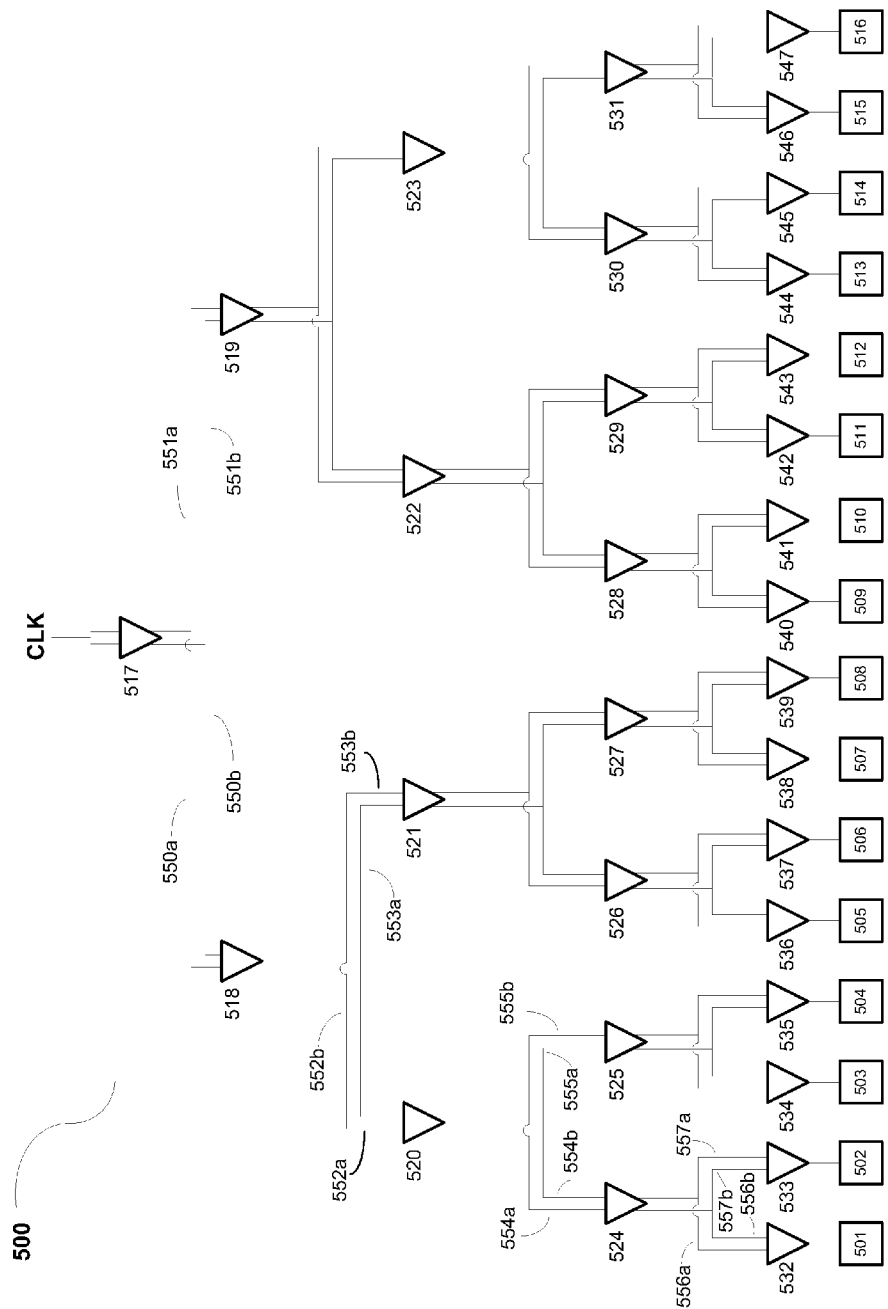
FIG. 5 is a diagram of a clock propagation circuit in accordance with an embodiment of the present invention.

FIG. 5 depicts a clock propagation circuit in which the simple inverters used for terminal nodes 32-47 in FIG. 1 have been replaced by protected buffers 532-547, each of which comprises the structure of inverter INV4 from FIG. 2. Moreover, the simple inverters used for input node 17 and intermediate nodes 18-31 have been replaced with protected buffers 517-531, each of which comprises the structure of inverter INV3 from FIG. 4. Advantageously, the circuit branches 50-57 have been duplicated to produce redundant branches 550a-557b.

Figure 6:
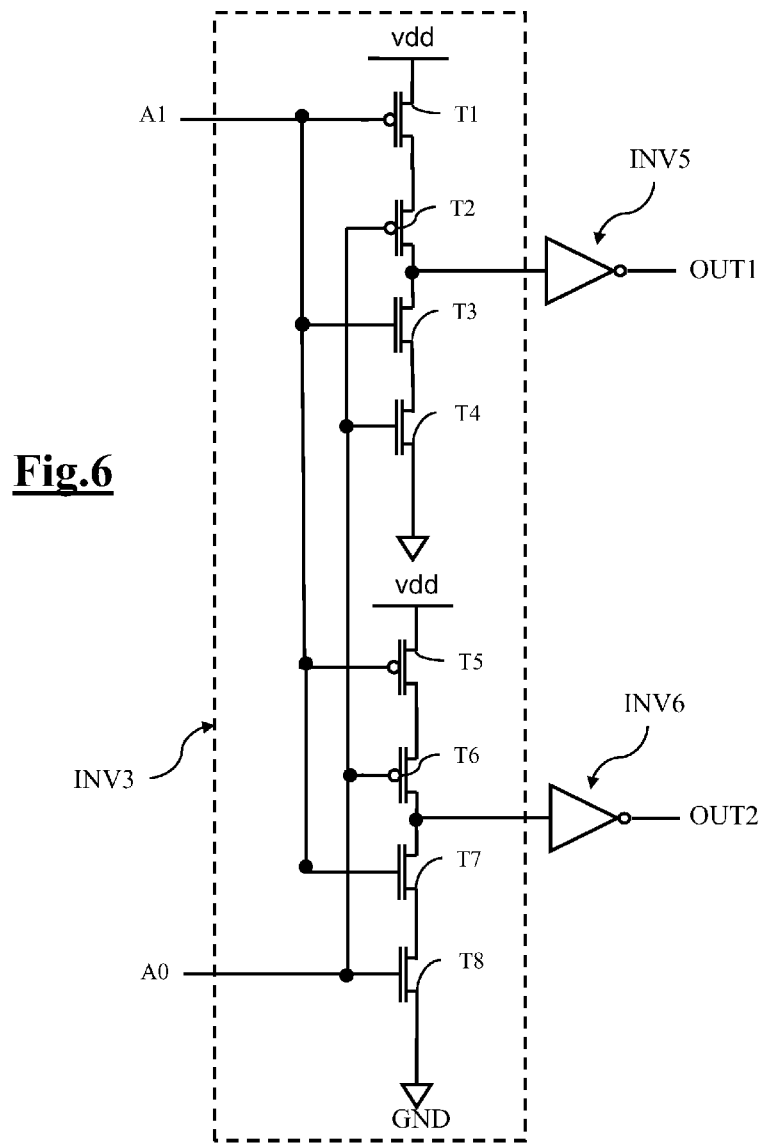
FIG. 6 illustrates the structure of an embodiment of a protected non-inverting buffer.
Figure 7:
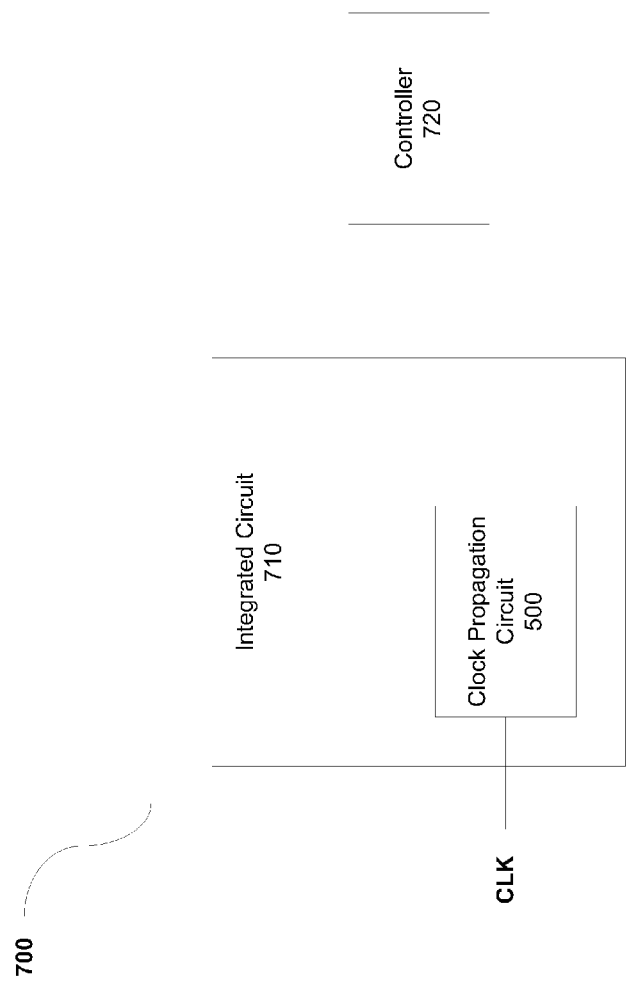
FIG. 7 is a block diagram of a system comprising the clock propagation *circuit of FIG. 5 in accordance with the present invention.

FIG. 6 depicts a protected non-inverting buffer, in which simple inverters INV5 and INV6 have been coupled to the respective outputs of inverter INV3 from FIG. 4 to allow the signals present on output terminals OUT1 and OUT2 to possess the logic levels present on input terminals A1 and A0. The advantages of inverter INV3, wherein disparate logic levels on input terminals A1 and A0 cause output terminals OUT1 and OUT2 to take on a high impedance state, are preserved.

The clock propagation circuit 500 may be included in an integrated circuit such as a clock circuit or an FPGA. And such an integrated circuit may be incorporated into an electronic system such as a computer system, and may be coupled to another component of the system such as a controller. FIG.

7 is a block diagram depicting one possible embodiment of such a system. A computer system 700 comprises an integrated circuit 710, which n turn comprises the clock propagation circuit 500 of FIG. 5. Clock signal CLK is coupled to the clock propagation circuit 500. The integrated circuit 710 s coupled to a controller 720.

From the foregoing it will be appreciated that, although specific embodiments of the invention have been described herein for purposes of illustration, various modifications may be made without deviating from the spirit and scope of the invention.

What is claimed is:

1. A circuit for distributing an initial logic signal towards a plurality of circuit components, the circuit comprising:
    an input node receiving the initial logic signal;
    a plurality of terminal nodes, each having two inputs and each providing a signal on an output representing the initial logic signal to a respective circuit component of the plurality of circuit components
        an output logic signal if said input logic signals for the respective node are substantially identical, or
        inactive, if said input logic signals for the respective node are different from each other; and
    a plurality of intermediate nodes coupled between the input node and the plurality of terminal nodes, each of the intermediate nodes comprising two inputs and two outputs, both outputs of each respective intermediate node providing a signal that is:
        an output logic signal if said input logic signals for the respective node are substantially identical, or
        inactive, if said input logic signals for the respective node are different from each other.

2. The circuit according to claim 1, wherein the two outputs of each respective intermediate node are connected to the respective inputs of an intermediate node or of a terminal node.

3. The circuit according to claim 2, wherein one or more of the intermediate nodes is spatially distant from another one of the intermediate nodes.

4. The circuit according to claim 1, wherein the input node and each of the plurality of intermediate nodes comprises a complex inverter with two inputs and two outputs, each of said nodes respectively providing on the first output and on the second output, first and second resulting signals, which respectively are:
    the inverse of said received input signals if said received input signals are identical, or
    inactive if said received input signals are different from each other.

5. The circuit according to claim 4, wherein the complex inverter comprises:
    a first p-type transistor receiving a power supply voltage on a source,
    a second p-type transistor, a source of which is connected to a drain of the first transistor,
    a third n-type transistor, a drain of which is connected to a drain of the second transistor,
    a fourth n-type transistor, a drain of which is connected to a source of the third transistor and a source of which is connected to a ground of the circuit,
    a fifth p-type transistor receiving the power supply voltage on a source,
    a sixth p-type transistor, a source of which is connected to a drain of the fifth transistor,
    a seventh n-type transistor, a drain of which is connected to a drain of the sixth transistor,
    an eighth n-type transistor, a drain of which is connected to a source of the seventh transistor and a source of which is connected to the ground or the circuit,
    a gate of the first transistor, a gate of the third transistor, a gate of the fifth transistor and a gate of the seventh transistor being connected together to one of the two inputs of the complex inverter, a gate of the second transistor, a gate of the fourth transistor, a gate of the sixth and a gate of the eighth transistor being connected together to the other of two inputs of the complex inverter, a common drain of the second and third transistors being connected to one of the two outputs of the complex inverter, and a common drain of the sixth and seventh transistors being connected to the other of the two outputs of the complex inverter.

6. The circuit according to claim 1, wherein each terminal node of the circuit comprises a complex inverter with two inputs and an output, comprising:
    a first p-type transistor receiving a power supply voltage on a source,
    a second p-type transistor, a source of which is connected to a drain of the first transistor,
    a third n-type transistor, a drain of which is connected to a drain of the second transistor,
    a fourth n-type transistor, a drain of which is connected to a source of the third transistor and a source of which is connected to a ground of the circuit,
    a gate of the first transistor and a gate of the third transistor being connected together in order to receive one of the two input signals on the first input, a gate of the second transistor and a gate of the fourth transistor being connected together for receiving the other ones of the two input signals on the second input, and a common drain of the second and of the third transistor providing the resulting initial signal to the circuit component connected at the output of the complex inverter forming the terminal node.

7. The circuit according to claim 1, further comprising an even number of nodes in the tree structure upstream from a circuit component connected at the output of a terminal node.

8. The circuit according to claim 1, further comprising an odd number of nodes in the tree structure upstream from a circuit component connected at the output of a terminal node.

9. The circuit according to claim 1, wherein the circuit is a clock circuit distributing a clock signal to the different circuit components.

10. The circuit according to claim 1, wherein the circuit is a circuit distributing a set or reset signal to the different circuit components.

11. A circuit, comprising:
    a first buffer having first and second input nodes and first and second output nodes, operable to receive first and second components of a first logic signal on its respective first and second input nodes, further operable to generate first and second components of a second logic signal on its respective first and second output nodes if the first and second components of said first logic signal are substantially similar, and still further operable to cause each of its first and second output nodes to take on a high-impedance state otherwise; and
    a second buffer having first and second input nodes respectively coupled to said first and second output nodes of the first buffer and further having a first output node, the second buffer being operable to receive the first and second components of said second logic signal on its respective first and second input nodes, further operable to generate a first component of a third logic signal on its first output node if the first and second components of said second logic signal are substantially similar, and to cause its first output node to take on a high-impedance state otherwise.

12. A circuit, comprising:
a first buffer having first and second input nodes and first and second output nodes, operable to receive first and second components of a first logic signal on its respective first and second input nodes, further operable to generate first and second components of a second logic signal on its respective first and second output nodes if the first and second components of said first logic signal are substantially similar, and still further operable to cause each of its first and second output nodes to take on a high-impedance state otherwise; and
a second buffer having first and second input nodes respectively coupled to said first and second output nodes of the first buffer and further having a first output node, the second buffer being operable to receive the first and second components of said second logic signal on its respective first and second input nodes, further operable to generate a first component of a third logic signal on its first output node if the first and second components of said second logic signal are substantially similar, and to cause its first output node to take on a high-impedance state otherwise;
wherein said second buffer comprises a second output node, and is further operable to generate a second component of said third logic signal on its second output node if the first and second components of said second logic signal are substantially similar, and to cause its second output node to take on a high-impedance state otherwise.

13. The circuit of claim 12 wherein the first and second components of said first logic signal are substantially similar to the first and second components of said second logic signal.

14. The circuit of claim 12 wherein the first and second components of said first logic signal correspond to the logical complement of the first and second components of said second logic signal.

15. The circuit of claim 11, further comprising a third buffer having first and second input nodes and first and second output nodes, its first and second output nodes respectively coupled to the first and second input nodes of said first buffer, said third buffer being operable to receive first and second components of a fourth logic signal on its respective first and second input nodes, further operable to generate first and second components of said first logic signal on its respective first and second output nodes if the first and second components of said fourth logic signal are substantially similar, and still further operable to cause each of its first and second output nodes to take on a high-impedance state otherwise.

16. The circuit of claim 12 wherein the first logic signal comprises a clock signal.

17. The circuit of claim 12 wherein the first logic signal comprises a reset signal.

18. The circuit of claim 12 wherein one of said buffers further comprises:
first and second supply nodes;
a first PMOS transistor having a control node coupled to the first input node, a first conduction node coupled to the first supply node, and a second conduction node;
a second PMOS transistor having a control node coupled to the second input node, a first conduction node coupled to the second conduction node of the first PMOS transistor, and a second conduction node coupled to the first output node;
a first NMOS transistor having a control node coupled to the first input node, a first conduction node coupled to the first output node, and a second conduction node; and
a second NMOS transistor having a control node coupled to the second input node, a first conduction node coupled to the second conduction node of the first NMOS transistor, and a second conduction node coupled to the second supply node.

19. The circuit of claim 12 wherein one of said buffers further comprises:
first and second supply nodes;
a second output node;
a first PMOS transistor having a control node coupled to the first input node, a first conduction node coupled to the first supply node, and a second conduction node;
a second PMOS transistor having a control node coupled to the second input node, a first conduction node coupled to the second conduction node of the first PMOS transistor, and a second conduction node coupled to the first output node;
a first NMOS transistor having a control node coupled to the first input node, a first conduction node coupled to the first output node, and a second conduction node;
a second NMOS transistor having a control node coupled to the second input node, a first conduction node coupled to the second conduction node of the first NMOS transistor, and a second conduction node coupled to the second supply node;
a third PMOS transistor having a control node coupled to the first input node, a first conduction node coupled to the first supply node, and a second conduction node;
a fourth PMOS transistor having a control node coupled to the second input node, a first conduction node coupled to the second conduction node of the third PMOS transistor, and a second conduction node coupled to the second output node;
a third NMOS transistor having a control node coupled to the first input node, a first conduction node coupled to the second output node, and a second conduction node; and
a fourth NMOS transistor having a control node coupled to the second input node, a first conduction node coupled to the second conduction node of the third NMOS transistor, and a second conduction node coupled to the second supply node.

20. A system, comprising:
an integrated circuit, comprising
a first buffer having first and second input nodes and first and second output nodes, operable to receive first and second components of a first logic signal on said respective first and second input nodes of the first buffer, further operable to generate first and second components of a second logic signal on said respective first and second output nodes of the first buffer if the first and second components of said first logic signal are substantially similar, and still further operable to cause each of said first and second output nodes of the first buffer to take on a high-impedance state otherwise,
a second buffer having first and second input nodes respectively coupled to said first and second output nodes of the first buffer and further having a first output node, the second buffer being operable to receive the first and second components of said second logic signal on its respective first and second input nodes, further operable to generate a first component of a third logic signal on its first output node if the first and second components of said second logic signal are substantially similar, and to cause its first output node to take on a high-impedance state otherwise, wherein said second buffer comprises a second output node, and is further operable to generate a second component of said third logic signal on its second output node if the first and second components of said second logic signal are substantially similar, and to cause its second output node to take on a high-impedance state otherwise; and a controller coupled to the integrated circuit.

21. A method, comprising:

receiving first and second components of a first logic signal;

generating first and second components of a second logic signal when the first and second components of said first logic signal are substantially identical, and driving first and second nodes to a high-impedance state otherwise;

receiving said first and second components of the second logic signal; and generating first and second components of a third logic signal when the first and second components of the second logic signal are substantially identical, and driving third and fourth nodes to a high-impedance state otherwise.

22. The method of claim 21, wherein the first and second components of said first logic signal are substantially similar to the first and second components of said second logic signal.

23. The method of claim 21, wherein the first and second components of said first logic signal correspond to the logical complement of the first and second components of said second logic signal.

* * * * *

UNITED STATES PATENT AND TRADEMARK OFFICE
CERTIFICATE OF CORRECTION

| | | |
|---|---|---|
| PATENT NO. | : 7,741,877 B2 | Page 1 of 1 |
| APPLICATION NO. | : 11/713469 | |
| DATED | : June 22, 2010 | |
| INVENTOR(S) | : Philippe Roche | |

It is certified that error appears in the above-identified patent and that said Letters Patent is hereby corrected as shown below:

- In Claim 1, Column 9, Line 19, change the text "the plurality of circuit components" to
-- the plurality of circuit components, wherein the initial logic signal is: --.

Signed and Sealed this
Twenty-fifth Day of October, 2011

David J. Kappos
*Director of the United States Patent and Trademark Office*

UNITED STATES PATENT AND TRADEMARK OFFICE
CERTIFICATE OF CORRECTION

PATENT NO. : 7,741,877 B2  
APPLICATION NO. : 11/713469  
DATED : June 22, 2010  
INVENTOR(S) : Roche et al.

Page 1 of 1

It is certified that error appears in the above-identified patent and that said Letters Patent is hereby corrected as shown below:

Title page, item (73) Assignee, change the text "STMicroelectronics, SA" to
-- STMicroelectronics SA --.

Signed and Sealed this
Twentieth Day of December, 2011

David J. Kappos
*Director of the United States Patent and Trademark Office*